United States Patent [19]
Makino

[11] 3,777,289
[45] Dec. 4, 1973

[54] SELECTOR HAVING CONSTANT CURRENT SOURCES AND COMPENSATING DIODE FOR REDUCING AMBIENT TEMPERATURE EFFECTS ON VARACTOR TUNER

[75] Inventor: Shinichi Makino, Fujisawa, Japan

[73] Assignee: Tokyo Shibaura Electric Co., Ltd., Kawasaki-shi, Japan

[22] Filed: Dec. 14, 1972

[21] Appl. No.: 314,948

[30] Foreign Application Priority Data

Dec. 16, 1971 Japan .......................... 46/101404
Mar. 31, 1972 Japan .......................... 47/32443

[52] U.S. Cl. .................. 334/15, 307/264, 323/80, 325/465
[51] Int. Cl. .......................................... H03j 5/04
[58] Field of Search .................. 334/15; 325/464, 325/465; 323/80

[56] References Cited

UNITED STATES PATENTS 3,544,903 12/1970 Sakamoto .................... 334/15 X
3,652,960 3/1972 Sakamoto et al. ................ 334/15

*Primary Examiner*—Paul L. Gensler
*Attorney*—Robert D. Flynn et al.

[57] ABSTRACT

A channel selecting apparatus comprising a D.C. voltage source for generating different amounts of D.C. voltage corresponding to the respective channels, a plurality of channel diodes connected to the D.C. voltage, a common compensation diode connected between the diodes and an electronic tuner, the common compensation diode having the same characteristics as the channel diodes, and a pair of constant current sources for supplying currents to the channel diode and the compensation diode, thereby enabling the variable capacitance diode of the electronic tuner to be supplied with a specific voltage for selecting a given channel exactly as originally generated.

7 Claims, 10 Drawing Figures

SELECTOR HAVING CONSTANT CURRENT SOURCES AND COMPENSATING DIODE FOR REDUCING AMBIENT TEMPERATURE EFFECTS ON VARACTOR TUNER

This invention relates to a channel selecting apparatus and more particularly to a channel selecting apparatus for a tuner using variable capacitance diodes of voltage controlled type.

In recent years, there has come into practical use an apparatus for electronically switching over the channels of a television receiver. This electronic switching system is characterized in that the variable capacitance diode of a tuner is supplied with different amounts of D.C. voltage corresponding to the respective channels in the form of bias voltage, using an electronic tuner whose tuning circuit consists of the variable capacitance diode, thereby varying the equivalent capacitance of said diode for selection of a desired channel.

An electonic channel selecting apparatus in which the variable capacitance diode is impressed with a D.C. voltage corresponding to a desired channel generally has a D.C. source for selection of channels which consists of voltage dividing resistors connected to the B power supply source to set an output voltage in advance and an electronic switch for selectively drawing out a desired one of the voltages divided by said resistors as an output, said resistor and switch being provided for each channel. The respective output terminals of the aforesaid channel selecting D.C. source are connected to a plurality of channel diodes jointly constituting a sort of OR circuit. The respective electrodes at one end of all these channel diodes are jointly connected to a terminal for supplying bias voltage to the variable capacitance diode of the electronic tuner. Where there is thrown in an electronic switch associated with a desired channel, then a D.C. voltage corresponding to said channel is impressed on the variable capacitance diode of an electronic tuner through the aforesaid channel diode to actuate the tuning circuit of the tuner. The channel diode presents a relatively wide variation as about −2 mV/°C in forward voltage drop with ambient temperature, tending to give rise to the disturbance of tuning. Accordingly, even where a desired channel is selected, tuning is sometimes obstructed by increase in the temperature of a television receiving set itself or change in the temperature of the room where the receiving set is placed.

It is Accordingly the object of this invention to provide a channel selecting apparatus capable of impressing a D.C. voltage corresponding to a desired channel on a tuner exactly as originally generated independently of ambient temperature even when there is used the aforesaid channel diode.

The channel selecting apparatus of this invention is characterized in that the electrodes at one end of the respective channel diodes are connected to a D.C. source for generating different amounts of D.C. voltage corresponding to the respective channels; the electrodes at the opposite end of said channel diodes are connected together, and there are further provided a constant current source for conducting a current having the same value as that of the channel diodes through a common compensation diode having the same forward voltage-current characteristics as the channel diodes and another constant current source through which there pass current the channel diodes, thereby enabling the channel and compesation diodes always to present the same amount of forward voltage drop, and in consequence the variable capacitance diode of the tuner to be supplied with the forward voltage of the channel diodes exactly as originally generated, namely, a voltage truthfully representing a desired channel.

The present invention can be more fully understood from the following detailed description when taken in connection with reference to the accompanying drawings, in which:

FIG. 1 is a schematic circuit diagram of a channel selecting apparatus according to an embodiment of this invention;

FIG. 2 presents a detailed circuit arrangement of FIG. 1;

FIGS. 3A, 3B and 3C indicate the temperature characteristics of the apparatuses of FIGS. 1, 2 and 5:

Figure 1:
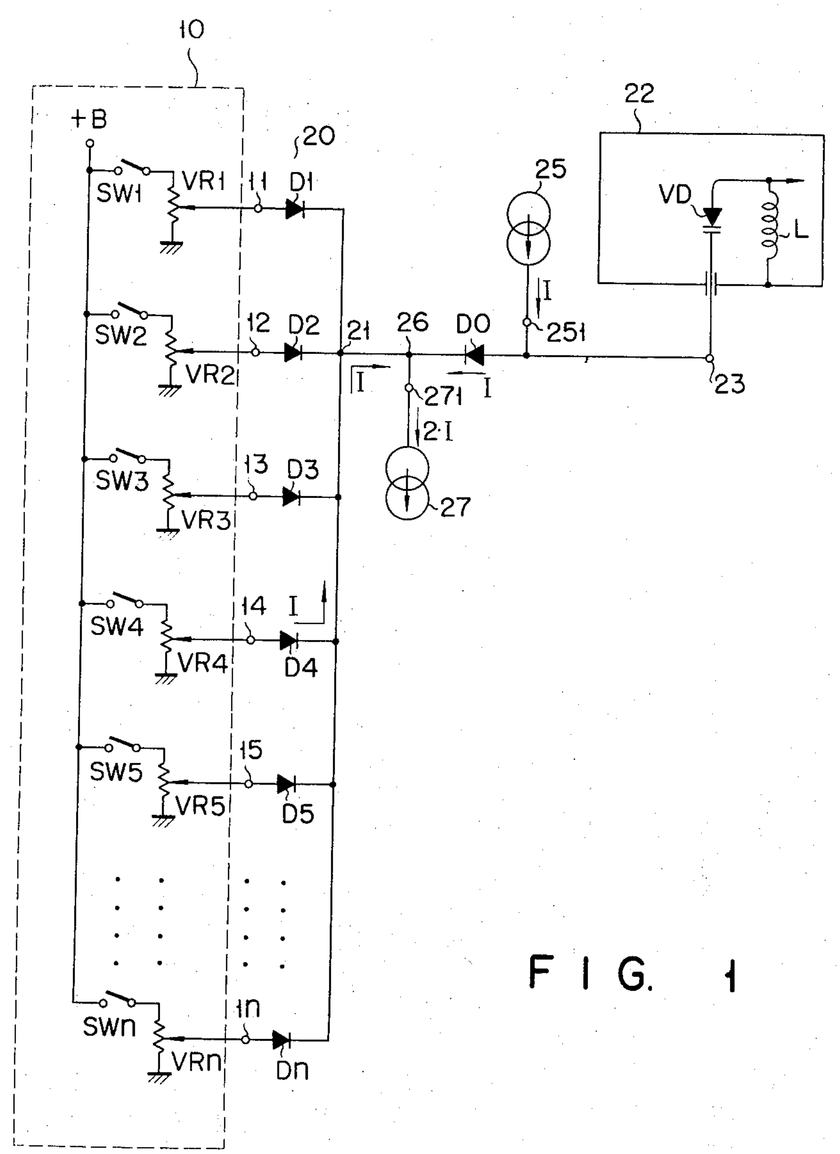

Referring to FIG. 1, there will now be described the basic concept of the first embodiment of this invention. To the channel selecting voltage terminals 11 to 1n of a channel selecting D.C. source 10 provided for the respective channels are connected in the forward arrangement a plurality of channel diodes D1 to Dn collectively acting as a sort of OR circuit 20. The common junction 21 of these diodes on the cathode side is connected to the bias control terminal 23 of the variable capacitance diode VD of an electronic tuner 22. Thus is arranged the channel selecting apparatus. The variable capacitance diode VD and inductance coil L form a tuning circuit.

The prior art channel selecting circuit part has the above-mentioned arrangement. Where a channel selecting switch SW4, for example, is turned on, then the channel selecting D.C. voltage of a voltage dividing variable resistor VR4 previously specified for the corresponding channel is impressed on the bias control terminal 23 through the corresponding channel diode D4. In this case, however, the channel selecting voltage is adversely affected by the temperature characteristics of said channel diode D4, failing to be conducted to the tuner exactly as originally generated.

To eliminate such drawback, the channel selecting apparatus of this invention has a common compensation diode D0 having substantially the same characteristics as the channel diodes D1 to Dn serially connected in the opposite direction thereto between the common junction 21 of said channel diodes D1 to Dn and the bias control terminal 23. As used herein, the term "same characteristics" is defined to mean substantially the same temperature characteristics and voltage-current characteristics. An integrated circuit enables diodes included therein to be easily provided with such same characteristics. Since both channel diodes D1 to Dn and common compensation diode D0 represent the same extent of voltage drop, the value of channel selecting voltage obtained at one of the terminals 11 to 1n are truthfully impressed on the bias control terminal 23, thereby enabling both types of diode to be supplied with a constant current I by constant current sources 25 and 27. Namely, the compensation diode D0 has its anode connected to the source 25 of the constant current I. Further, the source 27 of a constant current 2I is connected to the contact 26 of the common junction 21 of the channel diodes D1 to Dn and the compensation diode D0. Under such arrangement, Kirchhoff's law acts at the contact 26, causing the constant current I running through one of the channel diodes D1 to Dn and compensation diode D0 to be brought into said contact 26, thereby forming a constant current passage through which the constant current 2I is conducted to the source 27. The variable resistors VR1 to URn each have a resistance of the order of several KΩ units, while the constant current source 27 has an output impedance of the order of more than several MΩ units. Accordingly, the currents passing through the channel diodes D1 to Dn are made substantially equal independently of the values of divided voltage impressed on said channel diodes. The constant current I is only required to have a sufficient magnitude for the channel diodes D1 to Dn and compensation diode D0 to be rendered conducting. Therefore, the constant current sources 25 and 27 are so chosen as to produce a current of, for example, more than 50 microamperes. A voltage drop in one of the channel diodes D1 to Dn is equal to that in the compensation diode D0. Therefore, a channel selecting voltage obtained at one of the output terminals 11 to 1n of the D.C. voltage source 10 can be supplied to the bias control terminal 23 without being affected by change in the temperature of both diodes as well as in ambient temperature.

Figure 2:
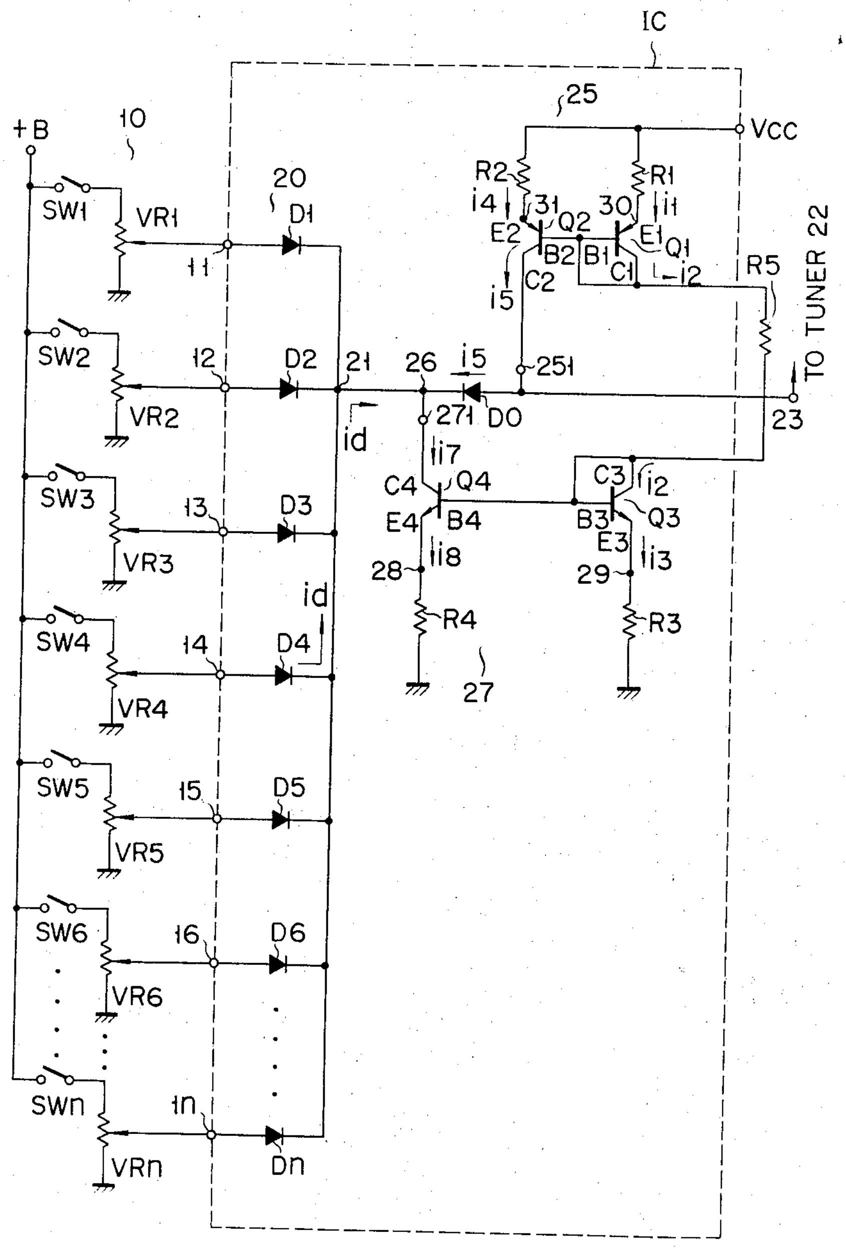

There will now be detailed this invention by reference to FIG. 2 showing the more concrete arrangement of FIG. 1. Throughout all the figures appended hereto, the same parts are denoted by the same numerals.

Referring to FIG. 2, the terminals at one end of a plurality of the channel selecting switches SW1 and SWn provided for the respective channels are collectively connected to the B power supply source generating a current of about +30V, and the terminals at the opposite end of said switches SW1 to SWn are connected to a plurality of voltage dividing variable resistors VR1 to VRn. For practical purpose, the channel selecting switches SW1 to SWn are preferred to consist of transistors or field effect transistors, but may be of mechanical type. The channel selecting D.C. source 10 is so operated as to impress the output terminals 11 to 1n of the variable resistors VR1 to VRn connected to the slidable arms thereof with different amounts of D.C. voltage corresponding to the respective channels. The slidable arms or output terminals 11 to 1n are connected to the anodes of the channel diodes D1 to Dn so as to prevent interchannel interference. The cathodes of said channel diodes D1 to Dn are jointly connected to form a sort of OR circuit 20. The common junction of said channel diodes D1 to Dn is connected to the cathode of the compensation diode D0 presenting the same forward voltage-current characteristics as the channel diodes D1 to Dn, the anode of said compensation diode D0 being connected to the bias control terminal 23. The cathode of the compensation diode is grounded through a series circuit consisting of the collector C4 and emitter E4 of an NPN transistor Q4 and a resistor R4 acting as the constant current source 27.

To the compensation diode D0 is connected the constant current source 25 mainly formed of a PNP transistor Q2 and constituted by the undermentioned circuit.

The collector C2 of the transistor Q2 acting as a constant current source is connected to the anode of the compensation diode D0, the emitter E2 of said transistor Q2 is connected to a power supply terminal Vcc through a resistor R2 and the base B2 thereof is connected to the base B1 of a transistor Q1 forming the bias circuit of the PNP transistor Q2. The emitter E1 of the transistor Q1 is connected to the power supply terminal Vcc and the collector C1 of said transistor Q1 is connected to the base B1. The last mentioned circuit substantially constitutes a diode circuit, namely a circuit for defining the base bias voltage of the transistor Q2, whose base B2 is connected through a resistor R5 to the collector C3 of the transistor Q3 forming part of the aforesaid constant current source 27. Said collector C3 is connected to the base B3 of the same transistor Q3. Accordingly, such a circuit constitutes a diode circuit, or the base bias circuit of a constant current transistor Q4. Thus, the bias transistor Q3 has its emitter E3 grounded through a resistor R3 and its base B3 connected to the base B4 of a constant current transistor Q4. The transistors Q1 and Q3 connected by a resistor R5 jointly receive a current to actuate the transistors Q2 and Q4 with a constant current. Accordingly, the transistor Q4 is supplied with a current twice that which runs through the transistor Q2.

Where, in the above-mentioned circuit arrangement, there is selectively closed, for example, a channel selecting switch SW4, then there is produced a D.C. voltage for the corresponding channel in the slidable arm of a variable resistor VR4. This D.C. voltage renders the channel diode D4 conducting to supply a D.C. current id to the transistor Q4. The D.C. current id corresponds to the current I of FIG. 1 passing from the channel diode D4 to the contact 26. The constant current transistor Q4 is supplied by the constant current transistor Q2 with a current i5 having the same amperage as the current id through the compensation diode D0. This current i5 also corresponds to the current I of FIG. 1 passing from the constant current source 25 to the compensation diode D0. The current i5 can be made to have the same amperage as the current id by adjusting the resistance values of the emitter resistors R1, R2, R3 and R4 of the transistors Q1, Q2, Q3 and Q4 so as to have the later described relationship. Where the currents id and i5 have the same amperage, then the channel diode D4 and compensation diode D0 present the same extent of drop in the forward voltage, regardless of change in ambient temperature. Accordingly, the bias control terminal 23 for the variable capacitance diode VD is always supplied with the voltage appearing at the slidable arm of the variable resistor VR4 exactly as generated therein. This channel selecting D.C. voltage does not vary with ambient temperature.

Figures 3A, 3B, 3C:
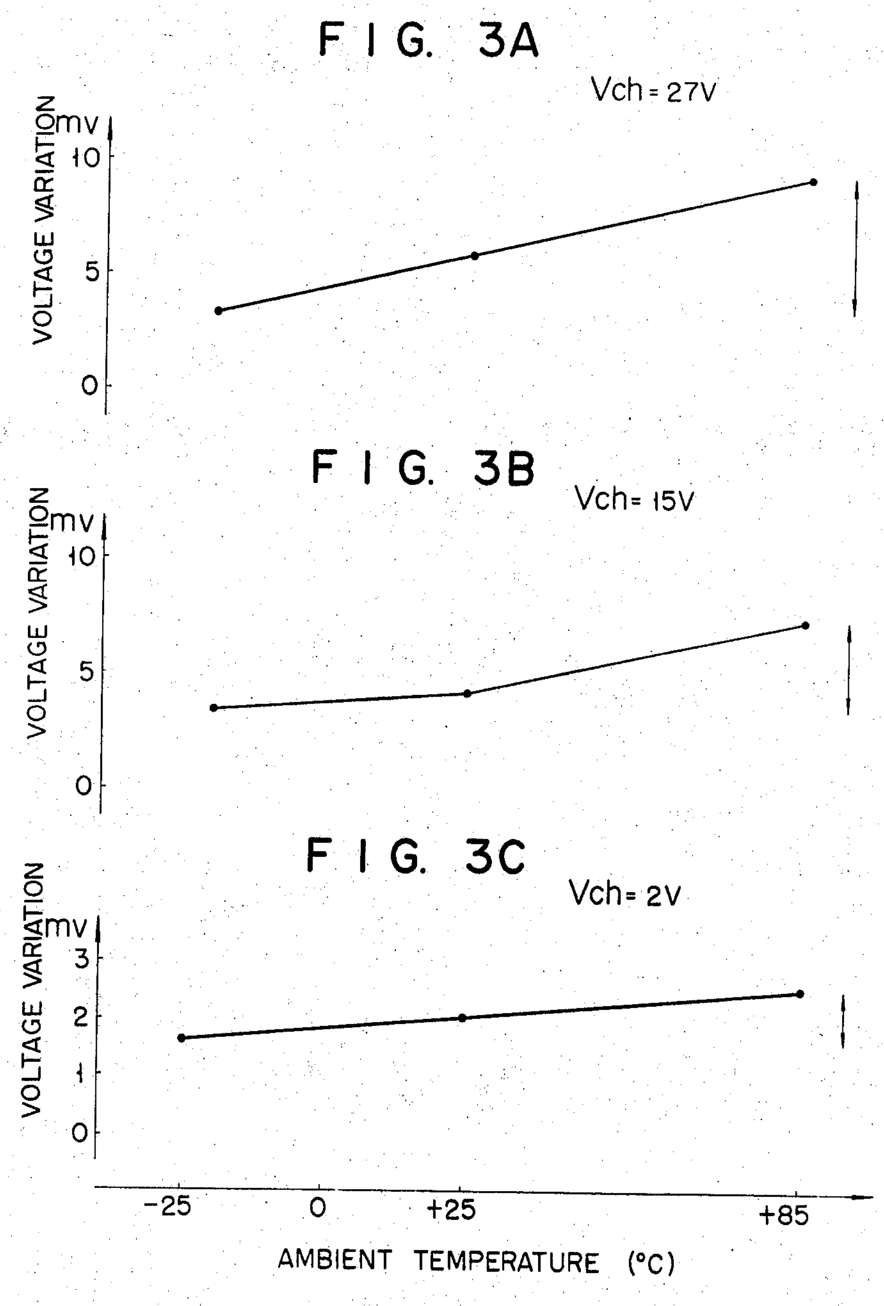

FIGS. 3A to 3C indicate the variation with ambient temperature of the channel selecting voltages Vch in the channel selecting circuitry of FIG. 2 where said voltages have 27V, 15V and 2V respectively. As apparent from these figures, the variation of the channel selecting voltages Vch is less than 5mV even when ambient temperature changes by 110°C. Accordingly, the tuning frequency indicates a variation of less than 100 KHz for the UHF band and less than 20 KHz for the VHF band, and is prevented from missing a selected channel. In contrast, the prior art channel selecting apparatus presented as wide a voltage change as 220 mV with the same temperature change, causing the tuning frequency to vary as much as 4.4 MHz, eventually failing to catch a selected channel.

As described above, the channel selecting apparatus of this invention has its voltage change limited to less than 5 mV at a temperature change of 110°C, attaining a receiving operation of extremely good resettability. Further, the tuning frequency of the present channel selecting apparatus shows a variation of about 100 KHz for the UHF band, eliminating the necessity of designing an automatic tuning device to have a broad tuning range in receiving the UHF channel Moreover, the present apparatus is free from an erroneous operation resulting from an image signal attracted to a sound signal whose frequency is displaced 4.5 MHz from that of an image carrier, or to an adjacent channel, thereby unfailingly catching a desired channel.

There will now be described the constant current characteristics of the aforementioned channel selecting circuitry particularly with respect to a section included in the broken lines of FIG. 2, or preferably a section subjected to circuit integration.

To make the current id have the same amperage as the current i5, the elements should meet the following three conditions for the properties:

i. The transistors Q1 and Q2 should be designed to carry out a sufficiently large degree of current amplification hfe.

ii. The transistors Q3 and Q4 should be designed to carry out a sufficiently large degree of current amplification hfe.

iii. The channel diodes D1 to Dn and compensation diode D0 should all have the same forward characteristics.

If, under the above-mentioned conditions, there is overlooked a backward current running through reversed direction junction of diodes, then there result the following equations:

For voltage drop in the transistors Q1 and Q3, $$Vcc = R1 \cdot i1 + VBE1 + i2 \cdot R5 + VBE3 + i3 \cdot R3 \ldots \quad (1)$$

For voltage drop in the transistor Q2, compensation diode D0 and transistor Q4, $$Vcc = R2 \cdot i4 + VCE2 + VD0 + VCE4 + i8 \cdot R4 \quad (2)$$

For the contact 26, $$id + i5 = i7 \quad (3)$$

In the above equations, VBE1 and VBE3 represent voltages across the emitter and base of the transistors Q1 and Q3 respectively. VCE2 and VCE4 denote voltages across the emitter and collector of the transistors Q2 and Q4. Likewisely, the voltages between the respective electrodes of the transistor are denoted by the corresponding numeral suffixed thereto. Since there is allowed a large degree of current amplification hfe for the transistors, $$\left.\begin{array}{r} i1 = i2 = i3 \\ i4 = i5 \\ i7 = i8 \end{array}\right\} \quad (4)$$

Requisite condition, $$i5 = id \quad (5)$$

From the equations (3) and (5)

$$2 \cdot i5 = i7 \quad (6)$$

The point is that the equation (6) be always satisfied. The conditions required to attain this condition may be expressed by the following equations (7), (8) and (9) derived from the equations (6), (4) and (2) respectively.

$$Vcc = R2 \cdot i5 + VCE2 + VD0 + VCE4 + 2 \cdot i5 \cdot R4 \quad (7)$$

For voltage V28 at the contact 28 between the emitter of the transistor Q4 and resistor R4, $$V28 = R4 \cdot i8 = 2.R4 \cdot i5 \quad (8)$$

For voltage V29 at the contact 29 between the emitter of the transistor Q3 and resistor R3, $$V29 = R3 \cdot i3 = R3 \cdot i1 \quad (9)$$

Where the voltage VBE3 across the emitter and base of the transistor Q3 is made equal to the similar voltage VBE4 of the transistor Q4, then the base electrodes of both transistors Q3 and Q4 will have the same potential, providing the same potential at the contacts 28 and 29.

Thus results the equation:

$$2 \cdot R4 \cdot i5 = R3 \cdot i1 \quad (10)$$

The voltage VBE across the base and emitter of a transistor may generally be determined from the following equation:

$$VBE = (KT/q)\ 1n\ (IE/i0)$$

where:

K= Boltzmann's constant
T= Absolute temperature
$q$= Electronic charge constant
IE= Emitter current
$i0$= Backward saturated current at the junction The base-emitter voltages VBE3 and VBE4 of the transistors Q3 and Q4 may be determined from the following equations:

$$VBE3 = (KT/q)\ 1n\ (IE3/i03) \quad (11)$$

$$VBE3 = (KT/q)\ 1n\ (IE4/i04) \quad (12)$$

Since the aforesaid transistors Q3 and Q4 included in the same integrated circuit have a fully uniform temperature distribution, there results the following equation:

$$IE3/i03 = IE4/i04 \quad (13)$$

This equation suggests that the intended object can be attained if the base current densities of the transistors Q3 and Q4 are the same and the degrees of current amplification hfe of these two transistors are equal.

Referring to the contact V30 between the emitter of the transistor Q1 and the resistor R1 and the contact V31 between the emitter of the transistor Q2 and the resistor R2, the following equations result:

$$V30 = Vcc - R1 \cdot i1 \quad (14)$$

$$V31 = Vcc - R2 \cdot i5 \quad (15)$$

If the transistors Q3 and Q4 have an equal base-emitter voltage, namely, an equal base current density and effect the same degree of current amplification hfe, then $$R2 \cdot i5 = R1 \cdot i1 \quad (16)$$

From the equation (10), $$R2 \cdot i5 = (2.R1.R4/R3 \cdot i5 \quad (17)$$

Therefore, $$R2 \cdot R3 = 2 \cdot R1 \cdot R4 \quad (18)$$

The above-mentioned relationships show that if the transistors Q1 and Q2 included in an integrated circuit are so designed as to have an equal base current density and carry out the same degree of current amplification hfe and similarly both transistors Q3 and Q4 have the same base current density and current amplification hfe and further the emitter resistance of all these transistors is chosen to have a value expressed by the equation (18), then the current density characteristics of said transistors will always make a channel selecting D.C. voltage at the slidable arm of the variable resistors VR equal to a voltage at the common output terminal 23, independently of temperature. Accordingly, the output terminal 23 is supplied with a voltage corresponding to a chosen channel exactly as originally generated, said voltage being later impressed on the tuner 22 as a bias voltage.

Figure 4:
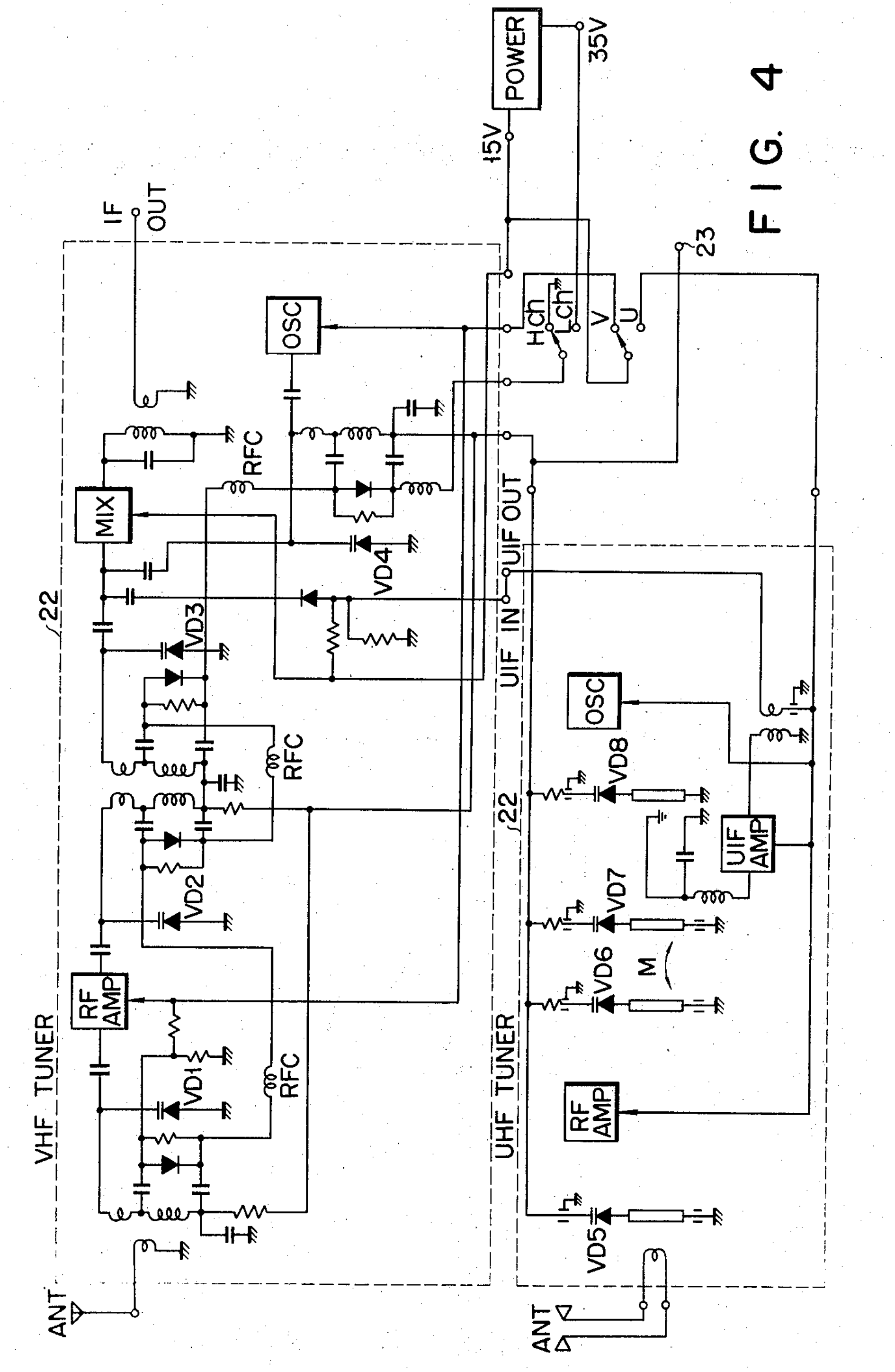
FIG. 4 is a circuit diagram of an electronic tuner connected to the apparatuses of FIGS. 1, 2 and 5.

There will now be described the electronic tuner 22 connected to the common output terminal 23 by reference to FIG. 4 showing the detailed circuit arrangement of said tuner 22. Since said tuner circuit arrangement is already known, there is omitted the description of the manner in which the circuit elements are connected. According to the previously described circuit arrangement of this invention, a channel selecting D.C. voltage impressed on the common output terminal 23 is conducted to at least the variable capacitance diodes VD1, VD2, VD3 and VD4 in selecting a VHF channel, effecting accurate tuning with said channel. In the case of selecting a UHF channel, the aforesaid D.C. voltage is supplied to at least the variable capacitance diodes VD5, VD6, VD7 and VD8, similarly attaining accurate tuning with said channel.

Figures 5, 6:
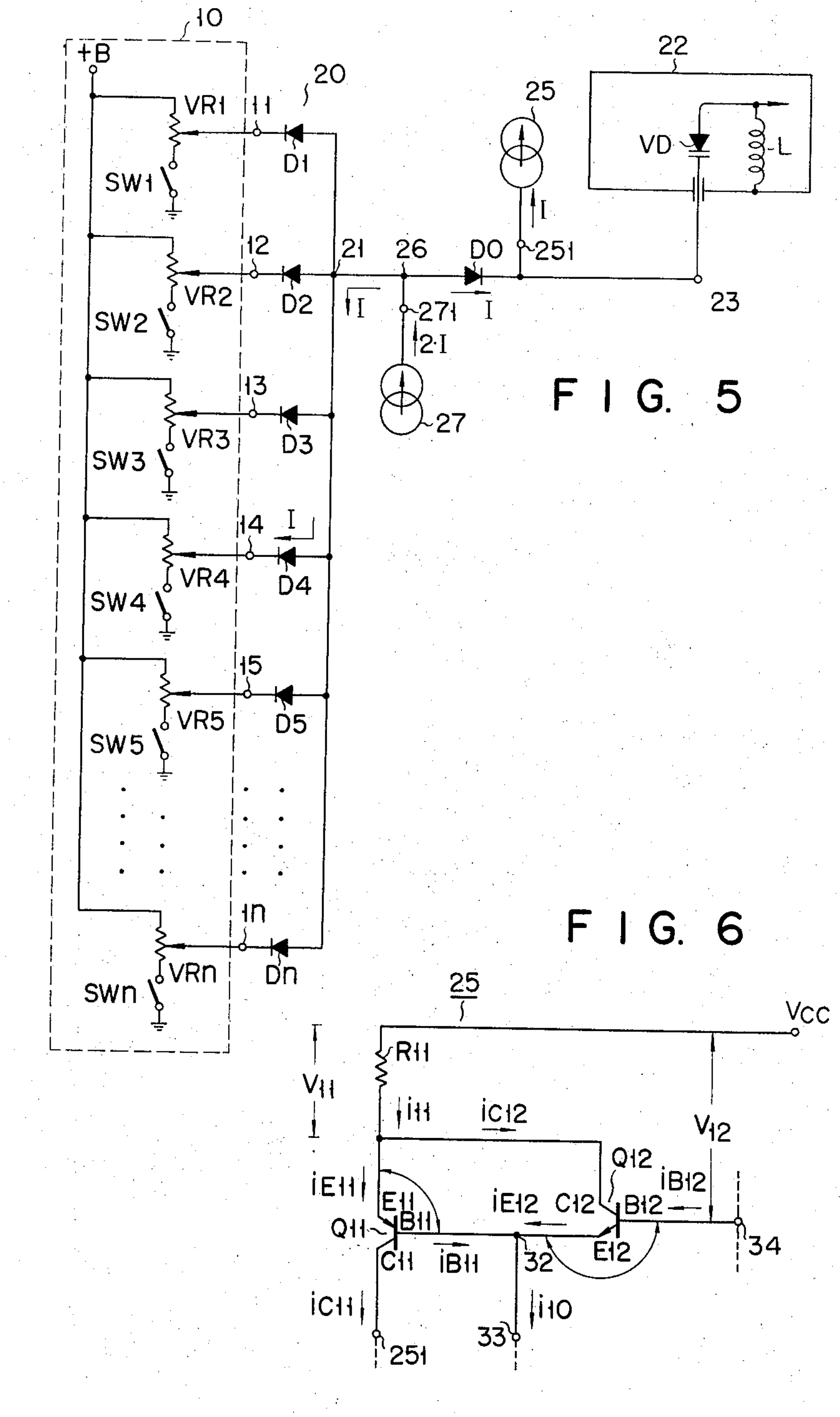
FIG. 5 is a circuit diagram of a channel selecting apparatus according to another embodiment of the invention.
FIGS. 6 to 8 indicate the circuit arrangements of modifications of a constant current source used with the apparatuses of FIGS. 1 and 2.

There will now be described with reference to FIG. 5 a channel selecting apparatus according to another embodiment of this invention. There are provided channel selecting switches SW1 to SWn between the respective voltage dividing variable resistors VR1 to VRn and the ground. The polarities of the channel diodes D1 to Dn corresponding to said resistors VR1 to VRn and the compensation diode D0 as well as the direction in which current flows through the constant current sources 25 and 27 are reversed from those used in the circuitry of FIG. 1. Therefore, the embodiment of FIG. 5 is operated in the same manner as that of FIG. 1, excepting that the current flow is reversed. Thus, where one of the channel selecting switches SW1 to SWn, for example, the switch SW4 is turned on, then the cathode of the corresponding channel diode D4 will have a lower potential than that of the remaining channel diodes. As the result, only this channel diode D4 is rendered conducting, causing the D.C. voltage at the slidable arm of the variable resistor VR4 to be conducted to the tuner terminal 23 without being effected by temperature change in the channel diode D4 owing to compensation diode D0.

Figure 7:
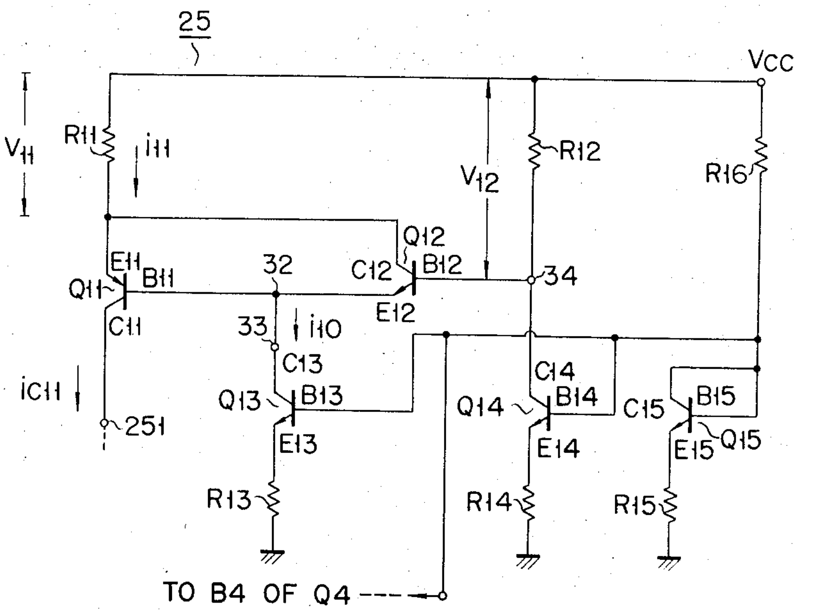
Figure 8:
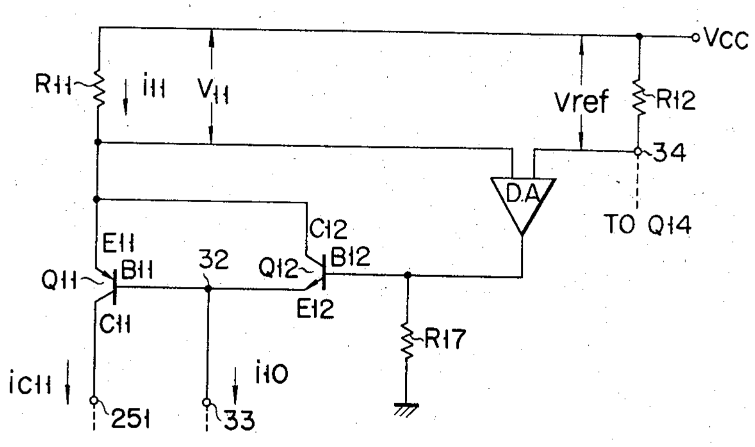

There will now be described by reference to FIGS. 6, 7 and 8 the circuit of the first constant current source 25 whose constant current characteristics have been improved. There will be explained the principle by which said improvement can be attained by reference to FIG. 6. The emitter E11 of a PNP transistor Q11 is connected to a positive power source Vcc through a resistor R11. The emitter E11 and base B11 of said transistor Q11 are connected to the collector C12 and emitter E12 of an NPN transistor Q12 respectively. With a voltage across the base B12 of the transistor Q12 and the contact between the resistor R11 and positive power supply source Vcc designated as V12, let it be assumed that there flows a certain current i10 through a terminal 33 to the outside from a contact 32 between the B11 of the transistor Q11 and the emitter E12 of the transistor Q12. Then the emitter of the transistor Q12 will have a lower voltage than the voltage V12 by an amount equal to the base-emitter voltage VBE12 of the transistor Q12. And the emitter of the transistor Q11 will have a higher voltage than the emitter voltage of the transistor Q12 by an amount equal to the base-emitter voltage VBE11 of the transistor Q11.

Concerning, therefore, the end voltage V11 of the resistor R11, there results the following equation:

$$V11 = V12 + VBE12 - VBE11 \quad (20)$$

Thus the current i11 running through the resistor R11 may be expressed as:

$$i11 = V11/R11 = (V12 + VBE12 - VBE11)/R11 \quad (21)$$

With the emitter current of the transistor Q11 represented by *i*E11 and the collector current of the transistor Q12 by $iC12$, then the aforesaid current $i11$ may be expressed as:

$$i11 = iE11 + iC12 \quad (22)$$

With the base and collector currents of the transistor Q11 denoted by iB11 and iC11 respectively, then $$iE11 = iB11 + iC11 \quad (23)$$

With the base and collector currents of the transistor Q12 designated as $iB12$ and $iC12$ respectively, then the emitter current $iE12$ of said transistor Q12 may be expressed as $$iE12 = iB12 + iC12 \quad (24)$$

Since the transistor Q12 generally carries out a large degree of current amplification hfe, the current $iB12$ has an extremely small value. Thus, $$iE12 \div iC12 \quad (25)$$

The aforesaid current $i10$ may be expressed as $$i10 = iB11 + iE12 \quad (26)$$

Therefore, the current $iC11$ may be expressed as follows from the equations (22) to (25)

$$iC11 = i11 - i10 = (V12 + VBE12 - VBE11)/R11 - i10 \quad (27)$$

If the aforesaid constant current circuit is integrated, then there results the following equation (28):

$$VBE12 - VBE11 << V12 \quad (28)$$

The above equation (27) may be converted as:

$$iC11 = V12/R11 - i10 \quad (29)$$

As apparent from the foregoing description, the current iC11 is not affected by change in the base-emitter voltages UBE11 and VBE12 of the transistors Q11 and Q12. Namely, the current $iC11$ is determined by the resistor R11 (having a constant resistance value), the voltage V12 and the delivered current $i10$. Said current $iC11$ does not theoretically constitute a function of output voltage, the output impedance of a constant current circuit caused by the transistor Q11 takes a substantially infinite value (more than 20 MΩ as actually measured). The current iC11 is not affected by change in the degree of current amplification hfe carried out by the transistors Q11 and Q12. Where, therefore, the constant current circuit is designed, consideration should be used to cause only the NPN transistor Q12 to effect a large degree of current amplification hfe. On the other hand, the minimum current amplification hfe conducted by the transistor Q11 is determined in consideration of a maximum value of the base current iB11 required to obtain the current $iC11$. Where the emitter current of the transistor Q12 is reduced to zero, the associated circuit becomes inoperative. If, therefore, a maximum value of the current iB11 is made smaller than $i10$, then it will be possible to design a constant current circuit so as to permit its operation even though the PNP transistor Q11 generally acting as a lateral type in an integrated circuit may carry out as small a degree of current amplification as about 0.1.

An output current delivered from the terminal 251 of the constant current circuit 25, namely, the collector current $iC11$ of the transistor Q11 can have a constant value by fixing V12 and $i10$ included in the equation (29). The voltage V12 and current $i10$ can be fixed by the circuit of FIG. 7. The contact 32 between the base B11 of the transistor Q11 and the emitter E12 of the transistor Q12 is grounded through the serially connected collector C13 and emitter E13 of an NPN transistor Q13 and a resistor R13. The base B12 of the transistor Q12 is connected to the positive power source Vcc through the resistor R12. The contact 34 between the base B12 and the resistor R12 is grounded through the serially connected NPN transistor Q14 and resistor R14. An NPN transistor Q15 has its emitter E15 grounded through a resistor R15 and its collector C15 and base B15 connected together. Said base B15 is connected to the bases B13 and B14 of the transistors Q13 and Q14 and said emitter E15 is connected to a positive power source through a resistor R16. Thus the circuit of FIG. 7 completes that of FIG. 6. There will now be described the operation of the circuit of FIG. 7. The transistor Q15 having its collector C15 and base B15 connected together forms a bias circuit by the action of its diode action, causing the bases B13 and B14 of the transistors Q13 and Q14 to be supplied with a fixed bias voltage. Accordingly, the aforesaid current $i10$ is fixed by the transistor Q13 and the collector current of the transistor Q14 is also made constant, thereby fixing the end voltage V12 of the resistor R12, and the output current $iC11$ delivered from the transistor Q11. The constant current circuit 25 of FIG. 7 may practically be formed by utilizing that of FIG. 2 with proper modification. In this case, it is only required to connect the terminal 251 of FIG. 7 to that of FIG. 2. With respect to the constant current circuit 27, the base B4 of the transistor Q4 is connected to the collector of the transistor Q15 forming a bias circuit so as to effect biasing operation. As described above, a lateral type transistor prepared in an integrated form can be used in forming the channel selecting circuitry of this invention.

Last, there will be described by reference to FIG. 8 another embodiment in which the constant current circuit can display more stable constant current characteristics. FIG. 8 only shows the improved bias circuit constituted by the base B12 of the transistor Q12. The base bias of the transistor Q12 is made more stable by a differential amplifier DA. This differential amplifier DA compares the end voltage V11 of the resistor R11 and a referential voltage Vref. For practical purpose, said referential voltage is derived from the voltage of the collector resistor R12 of the transistor Q14. A differential output from the differential amplifier DA generates in a resistor R17 a voltage which is later impressed on the base B12 of the transistor Q12. As the result, the base voltage of the transistor Q12 is so set as to equalize the voltage V11 and referential voltage Vref. Therefore, the current $i11$ running through the resistor R11 may be expressed as $$i11 = V11/R11 = Vref/R11$$

The current i11 is not affected at all by the base-emitter voltage of the transistors Q11 and Q12, but always remains constant. Where the current 110 is used as a constant current, then the output current iC11 delivered from the collector of the transistor Q11 will get more stable due to the relationship of $iC11 = i11 - i10$.

Application of the aforesaid integrated constant current circuit attains the generation of a more accurate and stable channel selecting voltage enabling variable capacity tuner to make a more truthful tuning.

The foregoing description refers to a television tuner. Obviously, the channel selecting apparatus of this invention is further applicable to, for example, an FM radio receiver.

What is claimed is:

1. A channel selecting apparatus comprising an electronic tuner whose tuning frequency is adjusted by biasing variable capacitance diodes by D.C. voltage; a source of D.C. voltage having switches for selecting broadcasting channels so as to generate selectively by said switches a D.C. voltage having a specific value for each channel; first diodes having the same number as the currently used channels which are rendered conducting when impressed with a D.C. voltage selected by the switches, the electrodes at one end of said first diodes being connected to the D.C. source for each channel and the electrodes at the opposite end thereof being collectively connected so as to conduct the selected D.C. voltage to the corresponding variable capacitance diode; a second diode used in common to the first diodes having substantially the same characteristics as said first diodes and connected in series with said first diodes and in the opposite polarity thereto between the common contact of said first diodes and the variable capacitance diodes; and a means having a first constant current source connected to the electrodes disposed on that side of the second common diode which is connected to the variable capacitance diodes and a second constant current source connected to the electrodes at said opposite end of the first diodes and generating a constant current whose value is substantially twice that of the first constant current source, thereby supplying an equal amount of constant current in the forward direction to any of the first diodes which is in a conducting state and also to the common second diode.

2. The channel selecting apparatus according to claim 1 wherein the D.C. source is formed by parallel connecting to said D.C. source a plurality of serially connected voltage dividing variable resistors and electronic switches provided for the respective channels, the D.C. voltage being selectively delivered from the slidable arms of said variable resistors.

3. The channel selecting apparatus according to claim 1 wherein the first diodes and second common diode have the polarities so arranged as to connect together the cathodes thereof; and the constant current supplying means is so positioned as to conduct a constant current from the first constant current source to the second common diode and receive the constant currents running through the first and second diodes from the second constant current source.

4. The channel selecting apparatus according to claim 1 wherein the first diodes and second common diode have the polarities so arranged as to connect together the anodes thereof; and the constant current supplying means is so positioned as to conduct a constant current to the first and second diodes from the second constant current source and receive a constant current passing through the second diode from the first constant current source.

5. The channel selecting apparatus according to claim 1 wherein the first and second constant current sources are formed of transistors having the opposite conductivity types.

6. The channel selecting apparatus according to claim 5 wherein the bias circuits of the transistor of the first constant current source and that of the second constant current source are jointly connected.

7. The channel selecting apparatus according to claim 6 wherein there is provided a differential amplifier in the bias circuit of the transistor of the first constant current source.

* * * * *

UNITED STATES PATENT OFFICE
CERTIFICATE OF CORRECTION

Patent No. 3,777,289 Dated December 4, 1973

Inventor(s) Shinichi MAKINO

It is certified that error appears in the above-identified patent and that said Letters Patent are hereby corrected as shown below:

Column 1, line 8, after "diodes of" insert --the--;
line 16, after "form of" insert --a--;
line 17, change "consists of" to --comprises--;
line 36, change "Where there" to --When the switch--;
line 43, after "give rise to" change "the" to --a--;
line 46, before "increase in" insert --an--;
between lines 54 and 55 insert the heading --Summary of the Invention--;

Column 2, line 10, delete "reference to";

Column 3, line 33, change "There will now be detailed this" to --The present--; after "invention" insert --will now be described in more detail--;

UNITED STATES PATENT OFFICE
CERTIFICATE OF CORRECTION

Patent No. 3,777,289 Dated December 4, 1973

Inventor(s) Shinichi MAKINO

It is certified that error appears in the above-identified patent and that said Letters Patent are hereby corrected as shown below:

Column 3, line 34, after "showing" change "the" to --a--;
line 44, change "purpose" to --purposes--;
line 45, change "consist of" to --comprise--;
line 46, after "may be of" insert --the--;

Column 5, line 36, after "running through" insert --the--;
line 37, after "junction of" insert --the--;
line 59, change "Likewisely" to --Likewise--;

Column 6, line 12, after "equation (6)" change "be always" to --should always be--;

Column 10, last line, after "As" delete "the" insert --a--;

Column 11, line 24, after "diodes by" insert --a--;
after "voltage" change ";" to --, comprising:--;
line 37, before "having substantially" insert --and--;
line 40, after "common" change "contact" to --connection--;

RM PO-1050 (10-69)

USCOMM-DC 60376-P69
U.S. GOVERNMENT PRINTING OFFICE : 1969 O—366-334.

UNITED STATES PATENT OFFICE
CERTIFICATE OF CORRECTION

Patent No. 3,777,289 Dated December 4, 1973

Inventor(s) Shinichi MAKINO

It is certified that error appears in the above-identified patent and that said Letters Patent are hereby corrected as shown below:

- 3 -

Column 11, line 41, after "diodes; and" delete "a" (first occurrence); change "having" to --including--;

Column 12, line 16, after "diode have" delete "the";

lines 16 and 17, delete "as to connect together" and insert --that--;

line 17, after "cathodes thereof" insert --are connected together--;

line 18, change "positioned" to --connected--;

line 26, after "diode have" delete "the";

lines 26 and 27, delete "as to connect together" and insert --that--;

line 27, after "thereof" insert --are connected together--;

line 28, change "positioned" to --connected--;

line 35, after "sources are" change "formed" to --comprised--.

Signed and sealed this 13th day of August 1974.

(SEAL)
Attest:

McCOY M. GIBSON, JR.
Attesting Officer

C. MARSHALL DANN
Commissioner of Patents